United States Patent
Sekiguchi

(10) Patent No.: US 8,963,125 B2
(45) Date of Patent: Feb. 24, 2015

(54) LED DEVICE, LED DEVICE ARRAY, AND METHOD OF DRIVING THE LED DEVICE ARRAY

(75) Inventor: Yoshinobu Sekiguchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/533,869

(22) Filed: Jun. 26, 2012

(65) Prior Publication Data

US 2013/0016170 A1    Jan. 17, 2013

(30) Foreign Application Priority Data

Jul. 13, 2011  (JP) ................................ 2011-154523
Mar. 2, 2012  (JP) ................................ 2012-046711

(51) Int. Cl.
| | | |
|---|---|---|
| B41J 2/01 | (2006.01) | |
| B41J 2/45 | (2006.01) | |
| H01L 29/18 | (2006.01) | |
| H01L 33/00 | (2010.01) | |
| H01L 33/20 | (2010.01) | |
| H01L 27/15 | (2006.01) | |
| H01L 33/38 | (2010.01) | |

(52) U.S. Cl.
CPC ............. *H01L 33/20* (2013.01); *H01L 27/153* (2013.01); *H01L 33/38* (2013.01); *B41J 2/45* (2013.01)
USPC .................. 257/20; 257/94; 257/103; 257/23; 257/24; 347/130; 347/238

(58) Field of Classification Search
USPC ......... 347/111, 112, 129, 130, 224, 225, 233, 347/238; 257/79, 88, 94, 101
See application file for complete search history.

(56) References Cited

U.S. PATENT DOCUMENTS

| | | | |
|---|---|---|---|
| 4,794,609 A | 12/1988 | Hara et al. | |
| 4,896,328 A | 1/1990 | Sekiguchi et al. | |
| 5,299,045 A | 3/1994 | Sekiguchi | |
| 5,907,572 A * | 5/1999 | Yamamoto et al. | 372/50.1 |
| 7,271,421 B2 | 9/2007 | Yukimoto et al. | 257/92 |
| 2005/0018730 A1* | 1/2005 | Taylor et al. | 372/50 |
| 2006/0208265 A1* | 9/2006 | Yukimoto et al. | 257/88 |
| 2008/0211400 A1* | 9/2008 | Kim et al. | 313/506 |
| 2009/0001391 A1* | 1/2009 | Ogihara et al. | 257/89 |
| 2009/0242904 A1* | 10/2009 | Nakai et al. | 257/88 |
| 2009/0285253 A1* | 11/2009 | Masui et al. | 372/45.01 |
| 2011/0241564 A1* | 10/2011 | Shimizu et al. | 315/291 |

FOREIGN PATENT DOCUMENTS

| | | |
|---|---|---|
| JP | 2005-064104 | 3/2005 |
| JP | 2007-207977 | 8/2007 |
| JP | 2009-021637 | 1/2009 |

* cited by examiner

*Primary Examiner* — Justin Seo
*Assistant Examiner* — Kendrick Liu
(74) *Attorney, Agent, or Firm* — Fitzpatrick, Cella, Harper & Scinto

(57) ABSTRACT

Provided is an LED device which is capable of reducing the emission size without changing the size of an LED and is capable of switching the emission size arbitrarily. The LED device includes, on a substrate, a carrier control layer, a lower current confinement layer, an active layer, and an upper current confinement layer. A p-type electrode is provided on the upper current confinement layer. Two n-type electrodes are arranged on the carrier control layer so as to dispose the p-type electrode between the two n-type electrodes in an in-plane direction of the substrate.

17 Claims, 15 Drawing Sheets

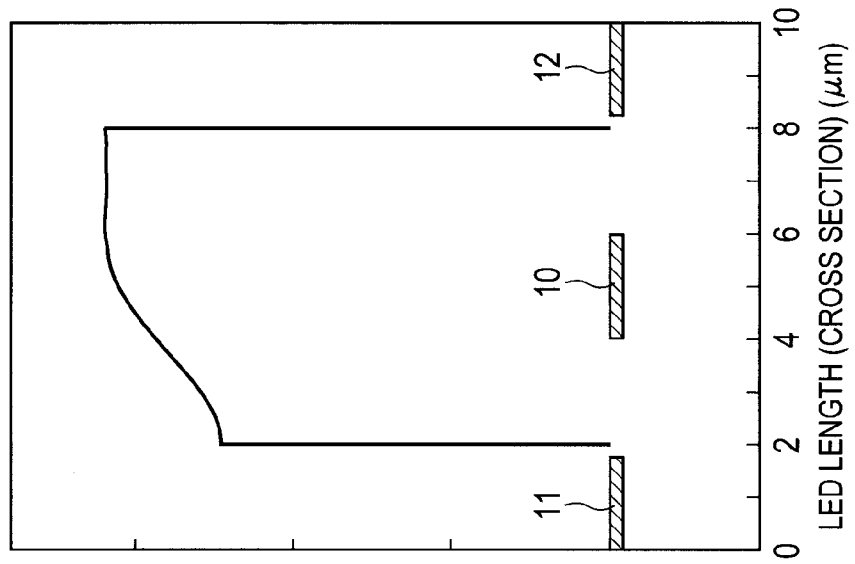
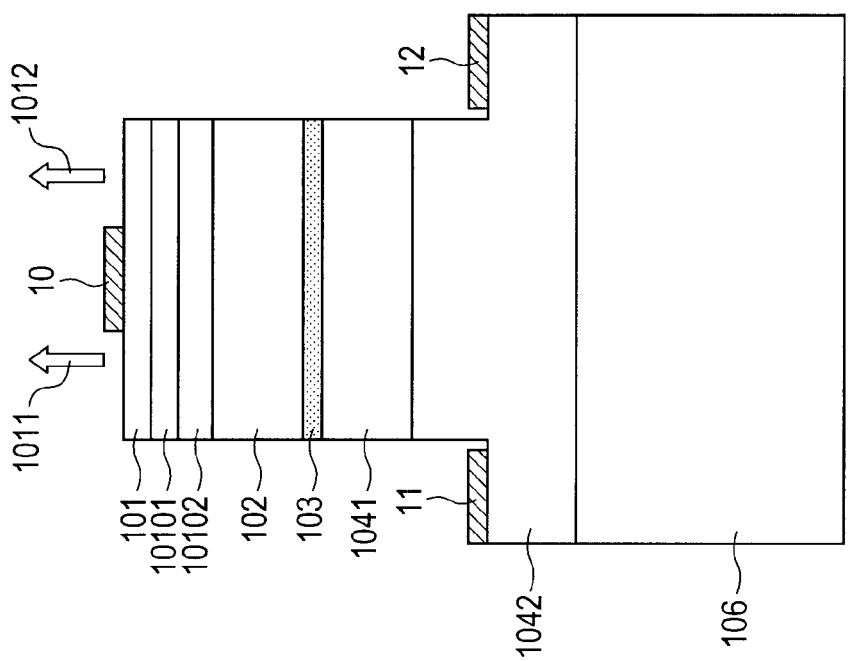

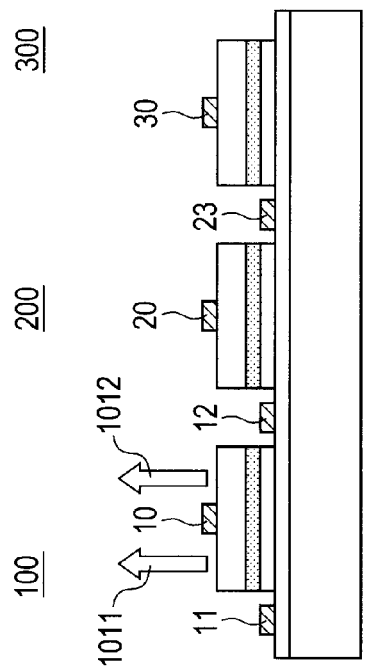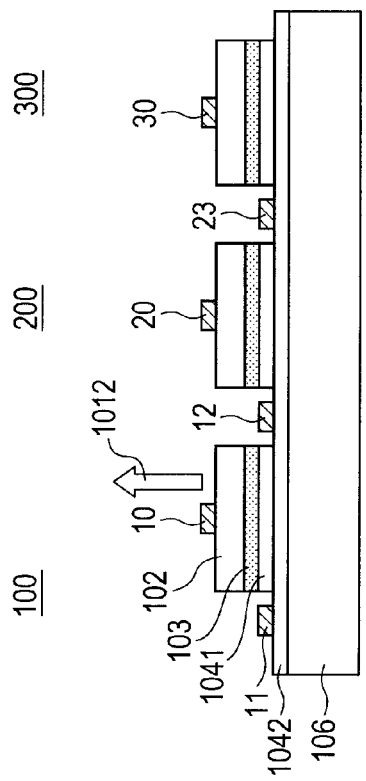

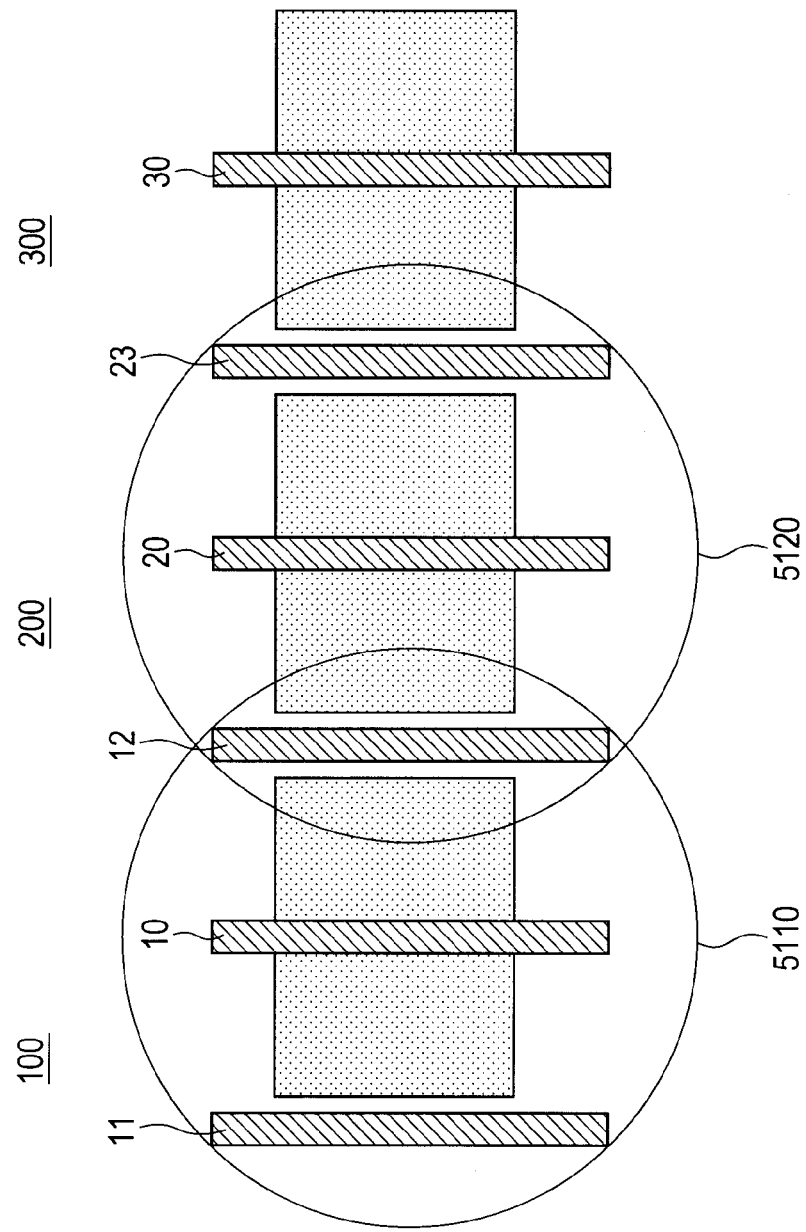

LED DEVICE, LED DEVICE ARRAY, AND METHOD OF DRIVING THE LED DEVICE ARRAY

BACKGROUND OF THE INVENTION

1. Field of the Invention

The present invention relates to an LED device, an LED device array, and a method of driving the LED device array, and more particularly, to an LED device and an LED device array, which enable partial control of emission intensity of an LED light emitting portion and are suitable for use as a light source for electrophotographic (EP) exposure in an LED scanner and an EP exposure device.

2. Description of the Related Art

In recent years, a printer that uses an LED array having an imaging spot pitch of 600 dpi or 1,200 dpi as a light source has been commercialized.

In the LED device array of 1,200 dpi, light emitting points are arranged in line on a semiconductor at a pitch of 21.2 µm and a light emitting point size of about 10 µm. Thus, high-resolution printing is realized by such microspots.

Such LED device array is illustrated in FIG. 10 as an LED array of Japanese Patent Application Laid-Open No. 2005-064104.

In FIG. 10, LEDs are arranged at a 1,200 dpi pitch, and four LEDs form one block.

A first electrode 7c, which is formed on a part of the upper surface of each light emitting portion 1, is connected to an individual one of four wirings 4 via an extraction wiring. A second electrode 3 is shared by four LEDs. The four wirings are connected to the first electrodes of corresponding LEDs of four blocks. Each block includes a bonding pad 6a connected to the second electrode 3 and a bonding pad 6c connected to one of the four wirings.

Through the selection of one of the four wirings functioning as a switch, an arbitrary LED can be caused to emit light.

With this configuration, the number of the bonding pads can be reduced, thereby enabling driving of a high density LED array.

On the other hand, as an LED device array that realizes a higher density, Japanese Patent Application Laid-Open No. 2007-207977 proposes a structure capable of reducing the emission point pitch and reducing the emission size. FIG. 13 illustrates the LED device array.

In FIG. 13, p-type electrodes 304a, 304b, and 304c are arranged on a first surface, and n-type electrodes 305a and 305b are arranged on a second surface on the opposite side across an active layer. Both the electrodes are formed so as not to superimpose their projections.

When the p-type electrode on the first surface and one of the nearest two n-type electrodes on the second surface are energized, the active layer positioned at an intermediate portion between both the electrodes is caused to emit light. In this manner, the emission point pitch and the emission size are reduced.

Note that, the LED device array of FIG. 13 includes a light emitting layer 301, a p-type current diffusion layer 302, an n-type current diffusion layer 303, and light emitting portions 306a, 306b, 306c, and 306d.

However, the LED device and the LED device array in the related art have the following problem.

For example, in an LED scanner that uses an LED device array as a light source, each LED device forms a single imaging spot on a photosensitive drum, and hence the pixel density in the horizontal scanning direction is determined by the density of LEDs.

A higher pixel density can be realized by an increase in density of the LED devices. However, the size of a drive circuit increases because of an increase in the ratio of the non-emission portions and an increase in number of the LED devices due to reductions in electrode width and emission area of the LED device. As a result, cost increases.

SUMMARY OF THE INVENTION

The present invention has been made in view of the above-mentioned problem, and it is an object thereof to provide an LED device, an LED device array, and a method of driving the LED device array, which are capable of reducing the emission size without changing the size of an LED and are capable of switching the emission size arbitrarily.

An LED device according to an exemplary embodiment of the present invention includes: a laminate structure on a substrate, the laminate structure including a carrier control layer, a lower current confinement layer, an active layer, and an upper current confinement layer in the stated order; a p-type electrode provided on the upper current confinement layer; and two n-type electrodes arranged on the carrier control layer so as to dispose the p-type electrode between the two n-type electrodes in an in-plane direction of the substrate. When the p-type electrode and one of the two n-type electrodes are energized, a light emitting face of the LED device is caused to emit light on the energized n-type electrode side. When the p-type electrode and the two n-type electrodes are simultaneously energized, an entire light emitting face of the LED device is caused to emit light. An LED device array according to an exemplary embodiment of the present invention includes: a plurality of the LED devices; and a first wiring and a second wiring for connecting the two n-type electrodes, in which, in adjacent ones of the plurality of the LED devices arranged in the array, one of the two n-type electrodes and another of the two n-type electrodes are alternately connected to the first wiring and the second wiring.

According to the exemplary embodiments of the present invention, it is possible to realize the LED device, the LED device array, and the method of driving the LED device array, which are capable of reducing the emission size without changing the size of the LED and are capable of switching the emission size arbitrarily.

Further features of the present invention will become apparent from the following description of exemplary embodiments with reference to the attached drawings.

BRIEF DESCRIPTION OF THE DRAWINGS

FIG. 1A is a diagram for illustrating a configuration example of an LED device according to a first embodiment and Example 1 of the present invention.

FIG. 1B is a graph showing the configuration example of the LED device according to the first embodiment and Example 1 of the present invention.

FIG. 2A is a diagram for illustrating a configuration example of an LED device array according to a second embodiment of the present invention, in which multiple LED devices are arranged in proximity.

FIG. 2B is a diagram for illustrating the configuration example of the LED device array according to the second embodiment of the present invention, in which the multiple LED devices are arranged in proximity.

FIG. 3A is a schematic plan view of an LED array, for schematically illustrating imaging spots formed on a photosensitive drum in a superimposed manner according to the second embodiment of the present invention.

DESCRIPTION OF THE EMBODIMENTS

Figure 3B:
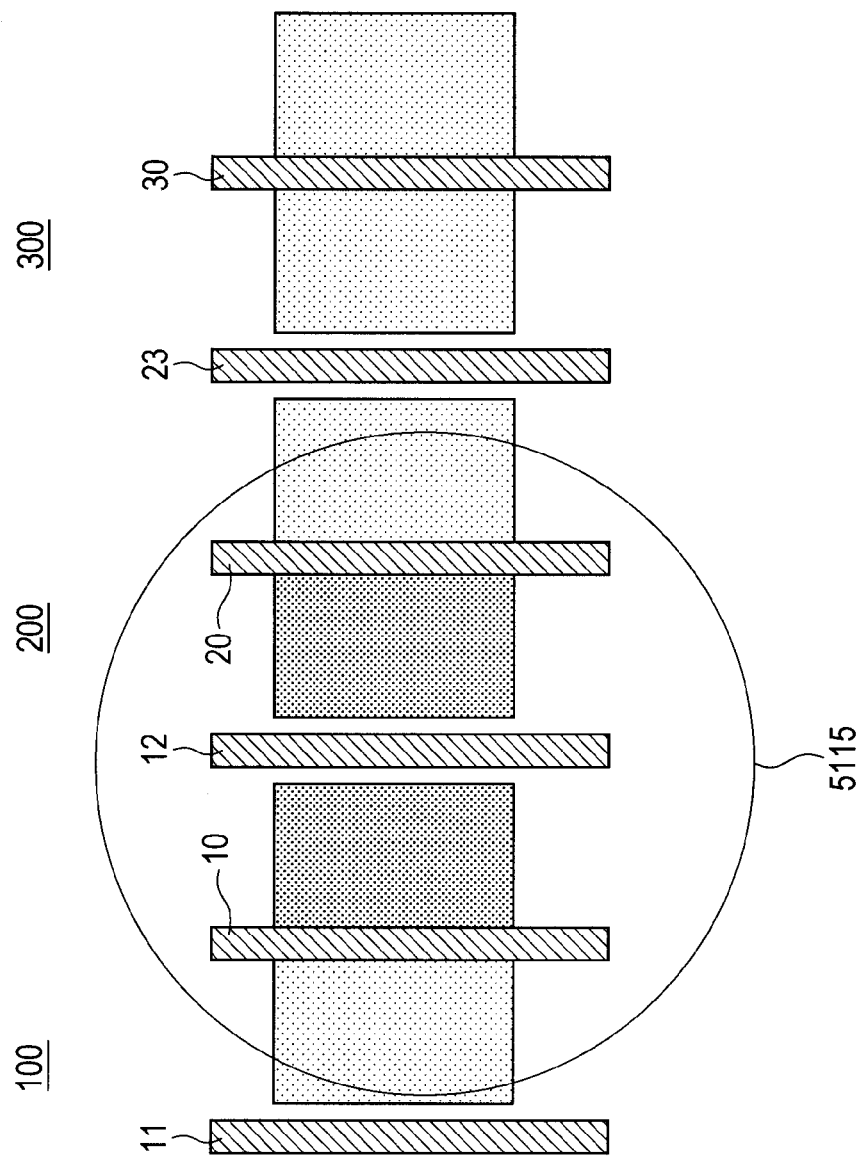
FIG. 3B is a schematic plan view of the LED array, for schematically illustrating imaging spots formed on the photosensitive drum in a superimposed manner according to the second embodiment of the present invention.

An LED device of the present invention includes two n-type electrodes on a carrier control layer so as to dispose a p-type electrode, which is provided on an upper current confinement layer, between the two n-type electrodes in the in-plane direction of a substrate.

According to the present invention, the n-type electrodes are provided on the carrier control layer to suppress diffusion of n-type carriers. When one of the two n-type electrodes is energized, the carriers in the carrier control layer are distributed more on the energized n-type electrode side so that strong emission may be obtained in part between the p-type electrode and the n-type electrodes.

This enables partial control of emission intensity of an LED light emitting face. According to the configuration of the LED device of the present invention, the emission size can be arbitrarily selected between the emission size corresponding to the entire LED light emitting face and an almost-half emission size without changing the size of the LED.

Further, an LED scanner that uses the LED device of the present invention enables a partial increase in definition by switching to a small imaging spot only at a portion required for high resolution.

In addition, an imaging spot can be formed on a photosensitive drum at the position corresponding to a region between adjacent LEDs, and the center of light intensity of the imaging spot can be controlled by superimposing exposure on the photosensitive drum.

In the conventional LED scanner, the LED emission size and position and the imaging spot size and position on the photosensitive drum in the horizontal scanning direction have a one-to-one correspondence, and hence it is impossible to correct the imaging position and change the imaging spot size.

In addition, in order to realize a higher resolution, it is necessary to provide an LED scanner in which LEDs having small light emitting faces are arranged at high density and also necessary to increase a driver because of an increase in scanning time and an increase in number of LEDs.

On the other hand, the LED scanner that uses the LED device of the present invention can arbitrarily switch between full emission and half emission of the LED.

With this, a small emission size can be set only to a portion required for high resolution, and a higher definition can be obtained by small imaging spots. Thus, the reduction in print speed can be minimized, and a high definition image can be obtained.

Further, the emission whose position is shifted by a half pitch from a pitch of full emission of the LED can be realized, and hence it is possible to correct the imaging position on a half pitch basis.

In addition, it is unnecessary to increase the driver, and, in the full emission mode, external extraction efficiency can be enhanced as compared to the conventional LED.

Further, according to an LED scanner for EP exposure that uses the LED device of the present invention as a light source, the imaging spots can be realized on the photosensitive drum at a higher density than the density of LEDs.

With this, image quality of high density imaging spots can be obtained without the lowering in optical power of the LED caused when LEDs having a small emission area are arranged at high density and without the significant increase in cost caused by the increase the drive circuit due to the increase in number of LEDs.

Further, a correction spot can be formed only at a required position, and hence a high definition image can be obtained without reducing print speed.

Hereinafter, an LED device, an LED device array, and a method of driving the LED device array according to embodiments of the present invention are described.

(First Embodiment)

As a first embodiment of the present invention, a configuration example of an LED device of the present invention is described with reference to FIGS. 1A and 1B.

The LED device of this embodiment has a laminate structure in which a carrier control layer, a lower current confinement layer, an active layer, and an upper current confinement layer are laminated on a substrate.

The active layer is caused to emit light by energizing a p-type electrode formed on the laminate structure and n-type electrodes.

As illustrated in FIG. 1A, a p-type electrode 10 is provided above the upper current confinement layer, and two n-type electrodes 11 and 12 are arranged on the carrier control layer so as to dispose the p-type electrode between the two n-type electrodes in the in-plane direction of the substrate.

Specifically, in the LED device of this embodiment, a carrier control layer 1042 and an n-side cladding layer (lower current confinement layer) 1041 are laminated on a substrate 106 including an n-type buffer layer.

Further, on the n-side cladding layer 1041, a light emitting layer (active layer) 103, a p-side cladding layer (upper current confinement layer) 102, current diffusion layers 10102 and 10101, a p-type contact layer 101, and the p-type electrode 10 are laminated in the stated order.

At both outer portions of the laminate structure, a region, which includes the light emitting layer (active layer) 103, from the p-type contact layer 101 to the n-type cladding layer (lower current confinement layer) 1041 is removed, and the two n-type electrodes 11 and 12 are formed on the carrier control layer 1042.

The two n-type electrodes are connected to different wirings.

The two n-type electrodes 11 and 12 are provided on the carrier control layer 1042 at both outer portions of the laminate structure so as to dispose the p-type electrode between the two n-type electrodes 11 and 12, and hence diffusion of n-type carriers can be suppressed. Thus, when one of the two n-type electrodes is energized, the carriers in the carrier control layer are distributed more on the energized n-type electrode side so that strong emission may be obtained in part between the p-type electrode and the n-type electrodes.

According to the configuration of the LED device of this embodiment, when the p-type electrode 10 and the n-type electrode 11 are energized, light 1011 can be emitted, and, when the p-type electrode 10 and the n-type electrode 12 are energized, light 1012 can be emitted.

When the two n-type electrodes 11 and 12 are set to the same potential and the p-type electrode 10 and the two n-type electrodes 11 and 12 are simultaneously energized, the light 1011 and the light 1012 are emitted from the entire original light emitting face of the LED device.

Therefore, with the use of a single LED, the emission size can be selected between the emission size corresponding to the original LED light emitting face and a small, almost-half emission size by selection of the energization to the two n-type electrodes.

On the other hand, for example, in the LED structure (FIG. 11) used in Japanese Patent Application Laid-Open No. 2005-064104 of the related art, a single n-type electrode is formed on a low resistance layer or a GaAs substrate disposed under an n-type cladding layer, to thereby sufficiently diffuse n-type carriers so that the LED is caused to emit light from the entire surface of the light emitting layer by the n-type electrode on one side.

Figure 11:
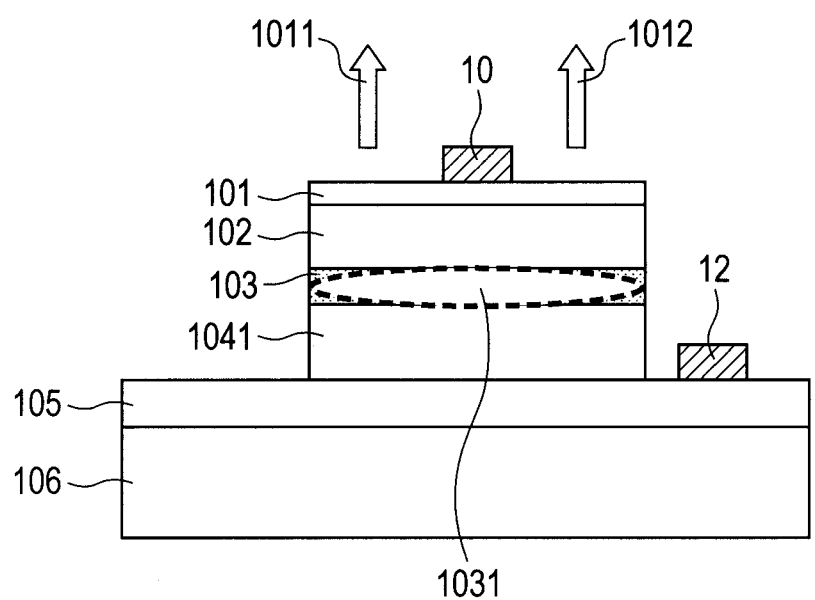
FIG. 11 is a diagram for illustrating a typified LED structure which is used in, for example, Japanese Patent Application Laid-Open No. 2005-064104 of the related art.

Note that, the conventional LED illustrated in FIG. 11 has a maximum light intensity 1031 at the active layer, which is positioned immediately below the p-type electrode disposed at the center of the light emitting portion. However, light is blocked by the p-type electrode, and hence light to be emitted to the outside is light in the outside region of the p-type electrode whose intensity has been reduced. Thus, light extraction efficiency is lowered.

On the other hand, according to the LED device of this embodiment, the driving for causing the LED to emit light from the entire surface of the light emitting layer is performed in a manner that the two n-type electrodes are set to the same potential and the p-type electrode and the two n-type electrodes are energized. In this case, the active layer positioned immediately below the p-type electrode has a low carrier density and low emission intensity, but the outside region of the p-type electrode has a high carrier density and high emission intensity. Thus, the efficiency of extracting light to the outside can be enhanced.

Note that, the carrier control layer has a function of controlling the injection of carriers into the n-type cladding layer and enhancing the emission intensity of the active layer positioned between the p-type electrode and the n-type electrodes. Therefore, an optimum composition and an optimum carrier density of the carrier control layer are selected depending on the composition and the carrier density of the n-type cladding layer. For example, the carrier control layer is preferred to be a member having such properties that carrier diffusion is slow as compared to a layer formed in an n-type electrode in a conventional LED. Note that, the carrier control layer only needs to be formed of a group 3-5 compound semiconductor containing Al.

Figure 14:
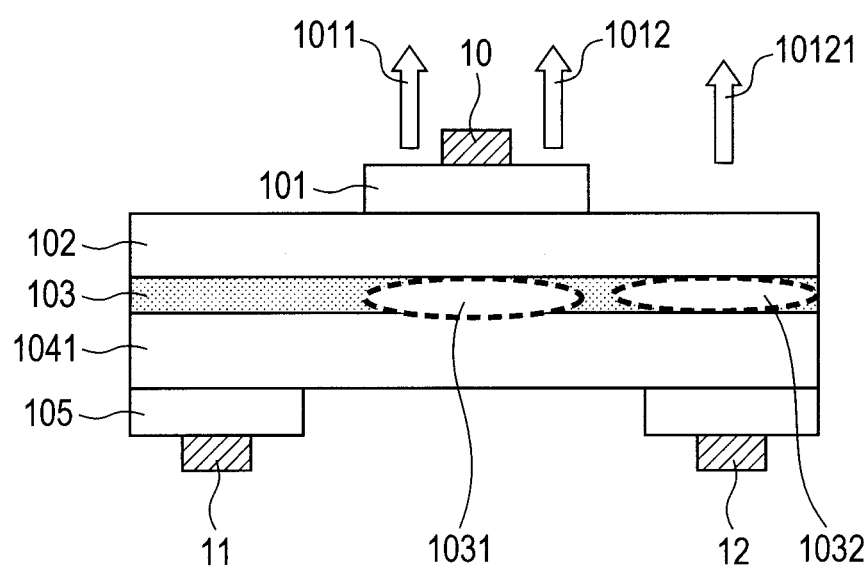
FIG. 14 is a diagram for illustrating a light emission pattern in Japanese Patent Application Laid-Open No. 2007-207977 of the related art.

Further, in Japanese Patent Application Laid-Open No. 2007-207977 of the related art, as illustrated in FIG. 14, emission 10121 occurs from the active layer positioned immediately above the n-type electrode, and hence the emission size increases. On the other hand, in the LED device of this embodiment, the n-type electrode is formed in the region in which the active layer has been removed, and hence no emission occurs in the vicinity of the n-type electrode. Thus, the emission size can be reduced to about half of the LED light emitting face.

Note that, in the configuration of this embodiment illustrated in FIG. 1A, the current diffusion layers 10101 and 10102 are arranged between the p-type contact layer 101 and the p-side cladding layer 102 so as to increase the diffusion of p-type carriers in the in-plane direction, to thereby increase a deviation of emission to the energized electrode side.

However, the present invention is not limited to this configuration. Even in the case of an LED without the current diffusion layers 10101 and 10102, the emission can be deviated to the energized electrode side.

Figure 7:
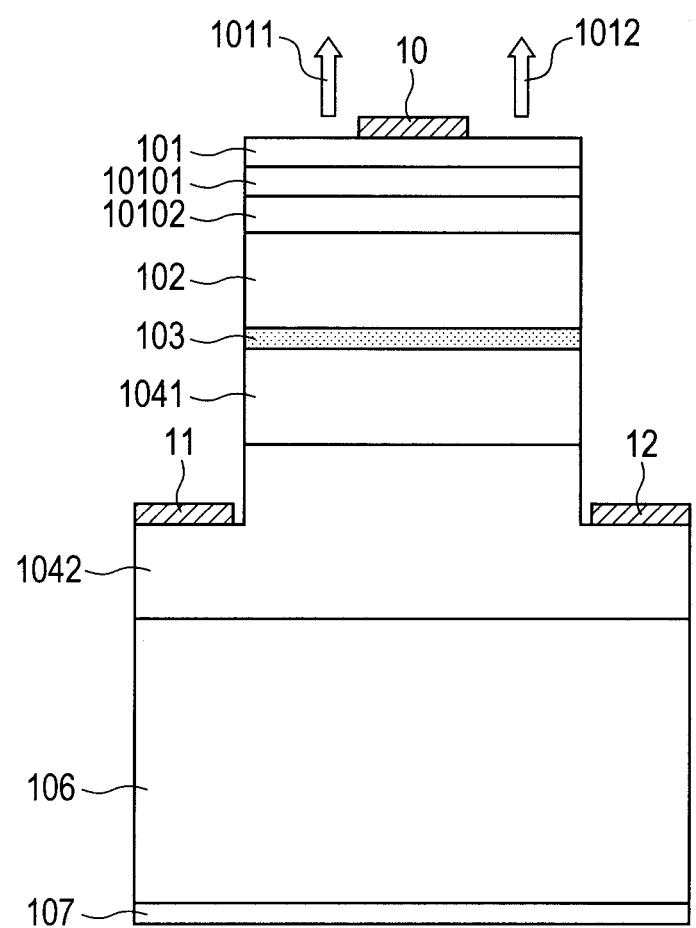
FIG. 7 is a diagram for illustrating another embodiment of the present invention, in which a second n-type electrode is formed on the surface of the substrate of the LED device according to the first embodiment of the present invention which is opposite to the light emitting face.

FIG. 7 is a modified example of the embodiment of the present invention. An LED device of the modified example includes, in addition to the two n-type electrodes (first n-type electrodes) of FIG. 1A, a second n-type electrode 107 which is formed on the surface of the LED device opposite to the light emitting face. When the second n-type electrode and the p-type electrode are energized, the LED can be caused to emit light from the entire surface of the light emitting layer.

(Second Embodiment)

As a second embodiment of the present invention, a configuration example of an LED device array including multiple LED devices of the present invention arranged in an array is described with reference to FIGS. 2A and 2B.

As illustrated in FIG. 2A, LEDs 100, 200, and 300 are disposed in proximity, and n-type electrodes 12 and 23 disposed between the LEDs are shared by the LEDs on both sides.

In this configuration, when the p-type electrode of the LED 100 and the n-type electrode 12 disposed between the LEDs 100 and 200 are energized, light 1012 is emitted from the LED light emitting face on the energized n-type electrode 12 side.

On the other hand, as illustrated in FIG. 2B, when the p-type electrode 10 of the LED 100 and the two n-type electrodes 11 and 12 are energized, light 1011 and light 1012 are emitted from the LED light emitting face on the n-type electrode 11 and 12 sides, respectively, and hence the entire original LED light emitting face emits light. The emitted light of FIGS. 2A and 2B forms an imaging spot on the photosensitive drum through a lens optical system.

FIG. 3A is a schematic plan view of an LED array, for schematically illustrating imaging spots formed on the photosensitive drum in a superimposed manner.

An imaging spot 5110, which is schematically illustrated by a circle, is formed on the photosensitive drum by the LED 100.

Figure 4:
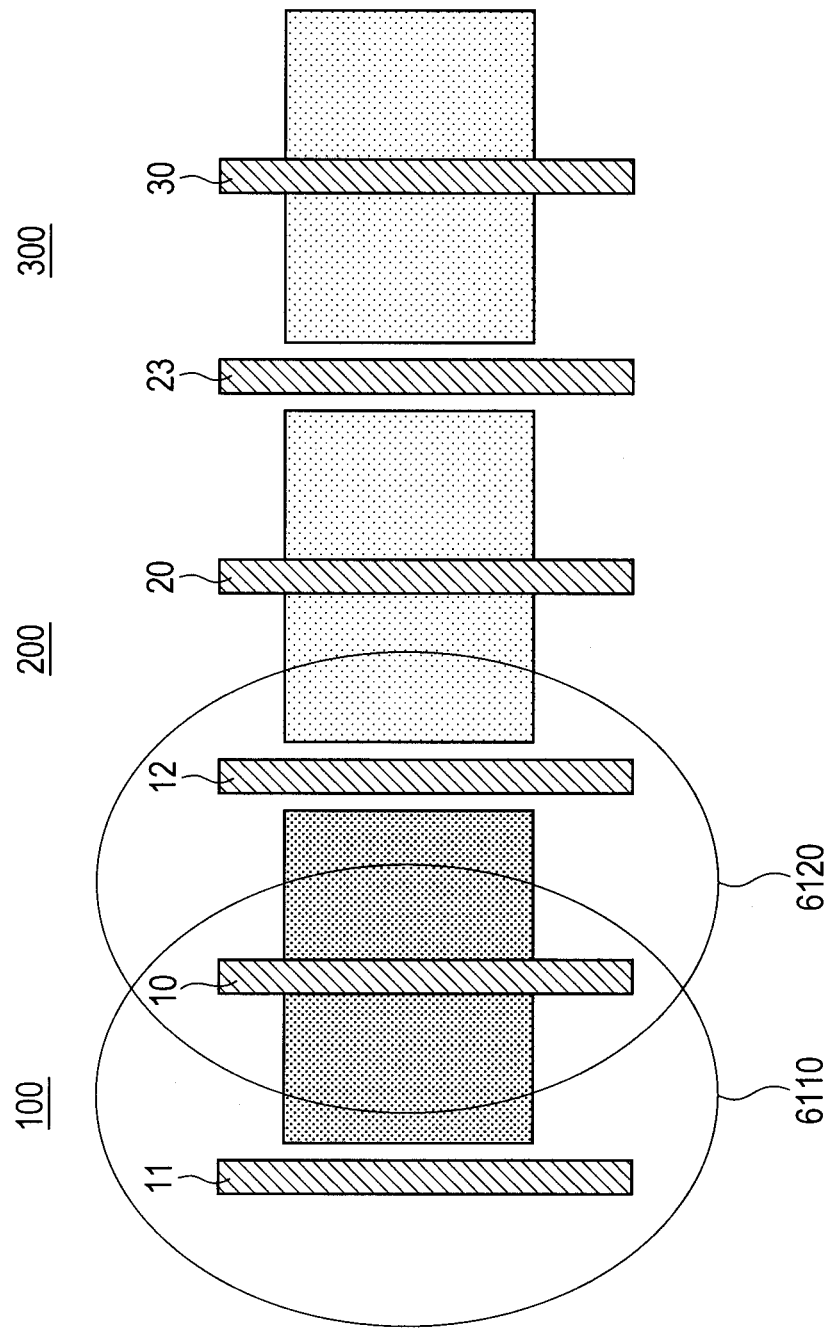
FIG. 4 is a schematic view for illustrating, by ellipses, imaging patterns to be formed on the photosensitive drum when a light emitting face of an LED is partially caused to emit light according to the second embodiment of the present invention.

In FIG. 4, an imaging spot (emitted light) 6120 is formed on the photosensitive drum by the light 1012 (FIG. 2A) resulting from the energization of the p-type electrode of the LED 100 and the n-type electrode 12 disposed between the LEDs 100 and 200.

When the p-type electrode 10 of the LED 100 and the n-type electrode 11 are energized, an imaging spot 6110 (emitted light) is obtained on the photosensitive drum. When the p-type electrode 10 of the LED 100 and the two n-type electrodes 11 and 12 are energized, the emitted light 6110 and the emitted light 6120 are obtained, and as a result of superimposing, the imaging spot 5110 of FIG. 3A is obtained on the photosensitive drum.

In other words, through the selective energization of the n-type electrodes, an imaging spot corresponding to the original light emitting face of the LED as well as a half imaging spot can be formed on the photosensitive drum.

With this, a latent image can be formed by a small imaging spot only in a region required for high definition, thus suppressing a reduction in print speed caused by small imaging spot formation and suppressing an increase in scanning speed.

FIG. 3B illustrates an imaging spot 5115 to be formed when the p-type electrode 10 of the LED 10 and the n-type electrode 12 are energized and when a p-type electrode 20 of the LED 200 and the n-type electrode 12 are energized.

The imaging spot 5115 (FIG. 3B) is formed in an intermediate region between the imaging spots 5110 and 5120 (FIG. 3A) formed by the entire light emitting faces of the LEDs 100 and 200. Thus, an imaging spot whose position is shifted by a half LED pitch can be obtained, and hence imaging spots having a density twice as high as an LED density can also be obtained.

Those imaging spots can also be formed by superimposing imaging spots whose energization timings are shifted.

A specific emission sequence is as follows.

First, the n-type electrodes 11, 12, and 23 are set to the same potential, and the p-type electrode 10 of the LED 100 and the p-type electrode 20 of the LED 200 are energized, to thereby cause the LED 100 and the LED 200 to emit light to form the imaging spots 5110 and 5120 (FIG. 3A).

Next, the n-type electrodes 11 and 23 are turned OFF, and the n-type electrode 12 shared by the LED 100 and the LED 200 is energized. In this manner, the imaging spot 5115 whose position is shifted by a half pitch is formed on the photosensitive drum so as to superimpose the imaging spots 5110 and 5120 of the LED 100 and the LED 200 (FIG. 3B).

Note that, after the imaging spot 5110 of FIG. 3A is formed on the photosensitive drum, the half imaging spot 6110 or 6120 of FIG. 4 may be formed in a superimposed manner at shifted energization timing. In this case, the center of the light amount in the imaging spot can be controlled.

Further, an image forming apparatus can be obtained by providing an LED device array including a plurality of the above-mentioned LED devices, a photosensitive member for forming an electrostatic latent image by light from the LED device array, a charging unit for charging the photosensitive member, and a developing unit for developing the electrostatic latent image.

Examples of the present invention are described below.

EXAMPLE 1

As Example 1 of the present invention, a configuration example of the LED device to which the present invention is applied is described with reference to FIGS. 1A and 1B.

In the LED device of this example, the p-type electrode 10 at the central region of the light emitting face is formed by Ti/Pt/Au lamination.

At both outer sides of the laminate structure, a region from the p-type contact layer 101 to the n-type cladding layer 1041, the region including the light emitting layer 103, is removed. The two n-type electrodes 11 and 12 on the carrier control layer 1042 are formed by AuGe/Ni/Au lamination.

The p-type contact layer 101 is formed of $Al_{0.15}Ga_{0.85}As$ at $10^{18}/cm^3$ or less. The current diffusion layers 10101 and 10102 are formed of $Al_{0.35}Ga_{0.65}As$ at $10^{18}/cm^3$ or less and $Al_{0.15}Ga_{0.85}As$ at $10^{18}/cm^3$ or less, respectively. The compositions of the layers described above are determined in consideration of absorption with respect to the emission wavelength of the LED.

The p-side cladding layer 102 is formed of $Al_{0.35}Ga_{0.65}As$ at $10^{17}/cm^3$ or less. The light emitting layer 103 is formed of an undoped $Al_{0.12}Ga_{0.88}As$. The n-type cladding layer 1041 is formed of $Al_{0.35}Ga_{0.65}As$ at $10^{17}/cm^3$ or less. The carrier control layer 1042 is formed of $Al_{0.35}Ga_{0.65}As$ at $10^{18}/cm^3$ at $10^{18}/cm^3$ or less. The n-type buffer layer and the substrate 106 are formed of GaAs at $10^{18}/cm^3$ or less.

The two n-type electrodes 11 and 12 on both outer sides of the light emitting portion are formed on the carrier control layer 1042 in the regions in which the n-type cladding layer 1041 has been removed.

The n-type electrodes are each formed of $Al_{0.35}Ga_{0.65}As$ at $10^{18}/cm^3$ or less similarly to the carrier control layer 1042. Accordingly, injection of carriers into the n-type cladding layer 1041 is controlled so that a carrier density distribution occurs in the n-type cladding layer, resulting in a distribution of injection of carriers into the light emitting layer 103. In the above-mentioned LED, when the p-type electrode 10 and the n-type electrode 12, which is one of the n-type electrodes, are energized, the carrier density in the light emitting layer 103 increases on the energized n-type electrode side to obtain strong emission.

FIG. 1B shows a carrier recombination rate distribution in the active layer 103 in this state. Light to be emitted to the outside of the LED is emitted from an outer portion of the electrode 10 having a high carrier recombination rate.

Note that, when the n-type electrodes 11 and 12 of FIG. 1A are set to the same potential and the p-type electrode 10 and the n-type electrodes 11 and 12 are energized, the light 1011 and the light 1012 are emitted from the entire LED light emitting face. In other words, the emission size corresponding to the LED light emitting face and a small, almost-half emission size are obtained by a single LED, and hence the emission size can be selected by selective energization of the two n-type electrodes.

In this example, the n-type cladding layer 1041 and the carrier control layer 1042 are formed of AlGaAs having the same Al composition. However, for example, in the case where the n-type cladding layer 1041 is formed of $Al_{0.7}Ga_{0.3}As$, the carrier control layer 1042 is formed of $Al_{0.5}Ga_{0.5}As$ so as to control the injection of carriers into the n-type cladding layer 1041, thereby optimizing the carrier distribution in the n-type cladding layer. The carrier control layer has such properties that carrier diffusion is slow as compared to a layer formed in an n-type electrode in a conventional LED.

Further, the n-type buffer layer and the substrate 106 are formed of n-type GaAs at $10^{18}/cm^3$ or less, but may be formed of high resistance GaAs as long as the carrier density in the n-type cladding layer can be optimized.

In addition, in order to reduce a contact resistance between the n-type electrode and the carrier control layer, the carrier control layer may be doped partially at a high concentration or another layer for reducing the contact resistance may be inserted.

Figure 12B:
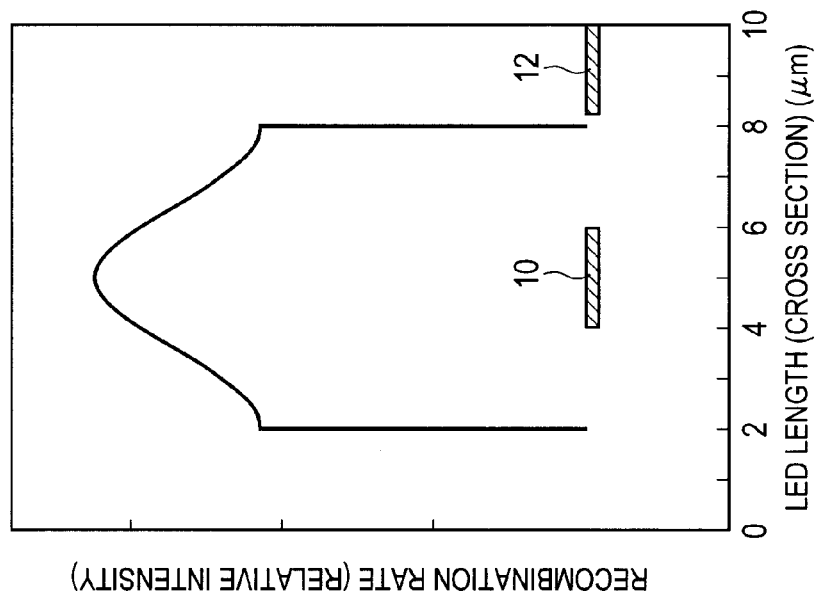
FIG. 12B is a graph showing the typified LED structure of the related art as the comparative example.
Figure 12A:
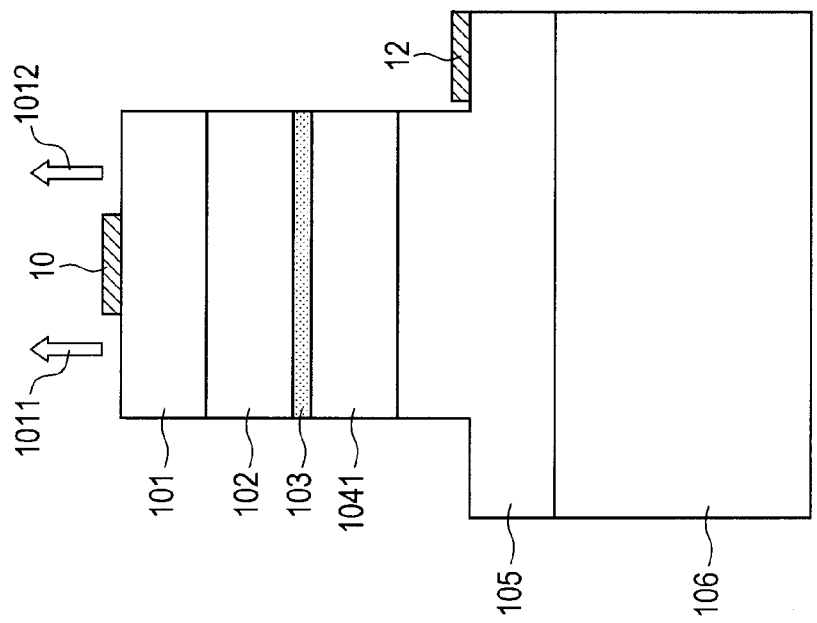
FIG. 12A is a diagram for illustrating the typified LED structure of the related art as a comparative example.
Figure 13:
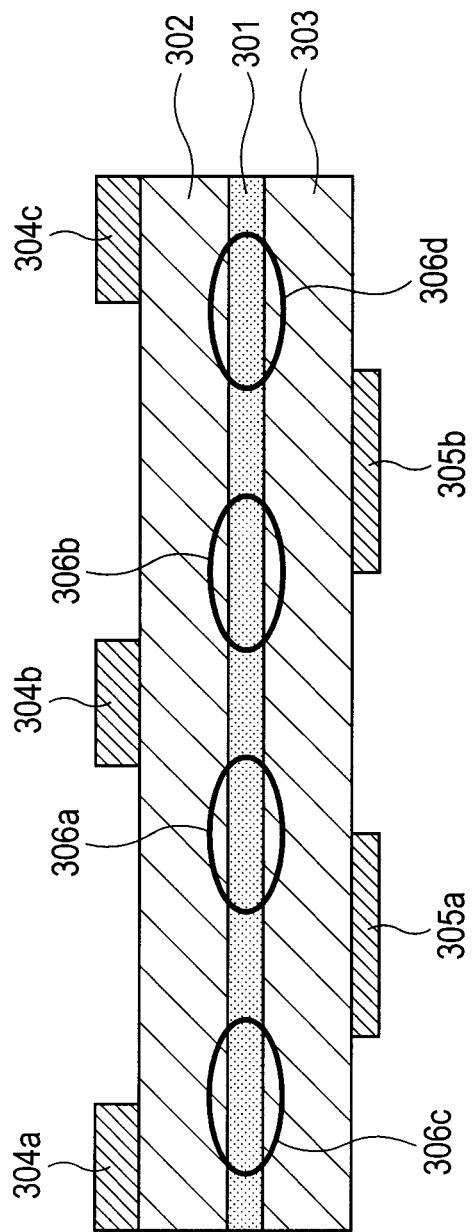
FIG. 13 is a diagram for illustrating a configuration of an LED device array in Japanese Patent Application Laid-Open No. 2007-207977 of the related art.

On the other hand, FIG. 12A illustrates a conventional LED structure in which an n-type electrode is formed on an n-type GaAs layer 105 (or a current diffusion layer having high mobility). Carrier diffusion is high in the n-type GaAs layer 105, and hence the carriers are uniformly distributed in the n-type GaAs layer 105 only by a single n-type electrode formed on one side. Therefore, as shown in FIG. 12B, the recombination rate is maximum at an active layer portion positioned below the p-type electrode whose p-type carrier concentration is highest, and emission intensity is also highest. However, light is blocked by the p-type electrode, and hence light having reduced intensity, which is positioned at the outer sides of the p-type electrode, is emitted from both sides of the p-type electrode.

EXAMPLE 2

Figure 5:
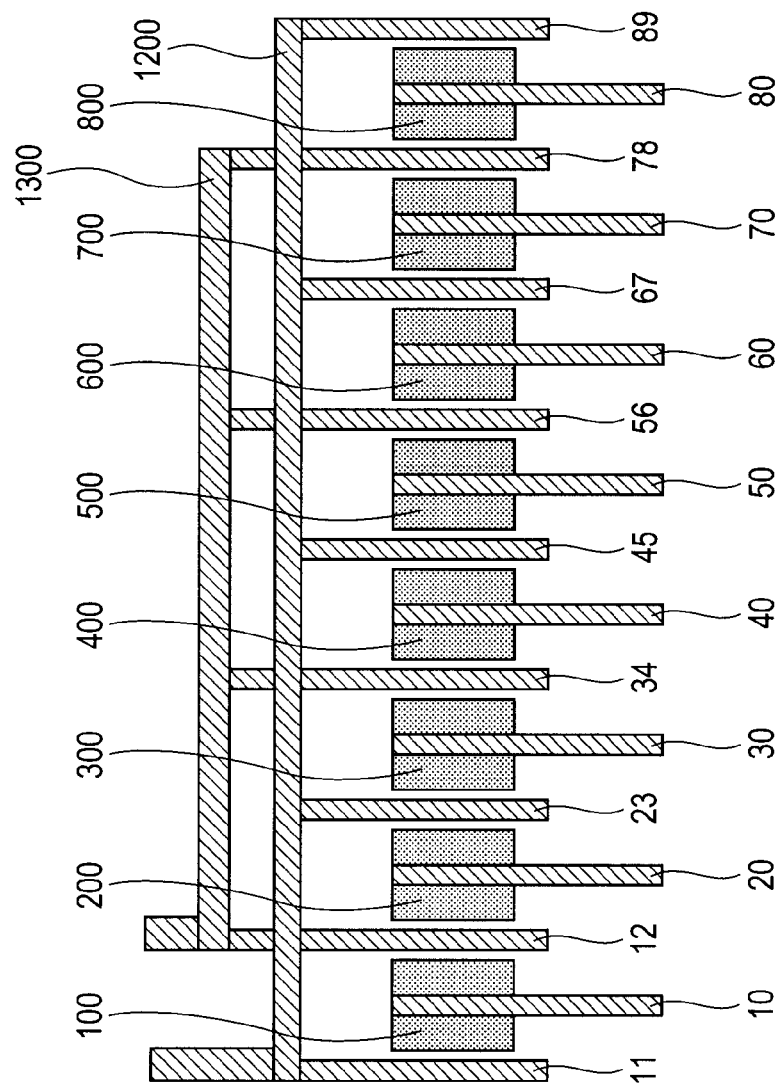
FIG. 5 is a diagram for illustrating a configuration example according to Example 2 of the present invention, in which common electrodes are alternately connected to a first wiring and a second wiring.

As Example 2 of the present invention, a configuration example of the LED device array that uses the LED device of the present invention as an EP exposing source is described with reference to FIG. 5. The same reference symbols as in the other drawings denote portions having the same functions.

The LED device array of this example includes eight LEDs 100, 200, . . . , and 800. The eight LEDs include p-type electrodes 10, 20, . . . , and 80, respectively, which are provided at a light emitting portion.

Between the LEDs, n-type electrodes 11, 12, 23, . . . , and 89 which are shared by adjacent LED devices are provided. The shared electrodes are alternately connected to different one of a first wiring 1200 and a second wiring 1300. In other words, one and the other of the n-type electrodes are alternately connected to the first wiring and the second wiring.

The LED device array is arranged so as to have a density equivalent to that of 1,200 dpi, and the LEDs are arrayed in line at a pitch of about 21.2 µm.

The n-type electrodes 11, 12, 23, . . . , and 89 of the LEDs are formed at an electrode width of about 2 µm. The n-type electrodes 12, 34, 56, and 78 are connected to the second wiring 1300, and the n-type electrodes 11, 23, 45, 67, and 89 are connected to the first wiring 1200.

The alternate connections of the n-type electrodes to different one of the first wiring and the second wiring enable emission of the LED light emitting portion on the energized n-type electrode side and also enable energization and emission of non-adjacent LEDs.

The size of the LED light emitting portion in the horizontal scanning direction depends on an imaging optical system. This example uses a same magnification imaging system, which is typically used in an LED scanner, and hence the LED light emitting portion of this example has the size of about 12 µm, and an individual electrode having a width of 2 µm is formed at the center thereof. The first wiring, the second wiring, ant the individual electrodes are connected to a drive circuit.

Referring to FIG. 4, when the p-type electrode 10 of the LED 100 and the n-type electrode 12 disposed between the LEDs 100 and 200 are energized, the imaging spot (emitted light) 6120 is formed on a photosensitive drum.

When the p-type electrode 10 of the LED 100 and the n-type electrode 11 are energized, the imaging spot 6110 (emitted light) is obtained on the photosensitive drum.

When the p-type electrode 10 of the LED 100 and the two n-type electrodes 11 and 12 are energized, the emitted light 6110 and the emitted light 6120 are obtained at the same time, and the imaging spot 5110 (FIG. 3A) having the superimposed emitted light is obtained on the photosensitive drum.

In other words, through the selective energization of the n-type electrodes, an imaging spot corresponding to the original light emitting face of the LED and further a half imaging spot can be formed on the photosensitive drum.

With this, a latent image can be formed by a small imaging spot only in a region required for high definition, thus suppressing a reduction in print speed caused by small imaging spot formation and suppressing an increase in scanning speed.

FIG. 3B illustrates the imaging spot 5115, which is formed when the p-type electrode 10 of the LED 100 and the n-type electrode 12 are energized and when the p-type electrode 20 of the LED 200 and the n-type electrode 12 are energized.

In this case, an imaging spot is formed in an intermediate region between the imaging spots 5110 and 5120 (FIG. 3A) which are formed by the entire light emitting faces of the respective LEDs 100 and 200. In other words, an imaging spot whose position is shifted by a half LED pitch can be obtained, and hence an imaging spot having a double LED density can be obtained as well.

EXAMPLE 3

Figure 6:
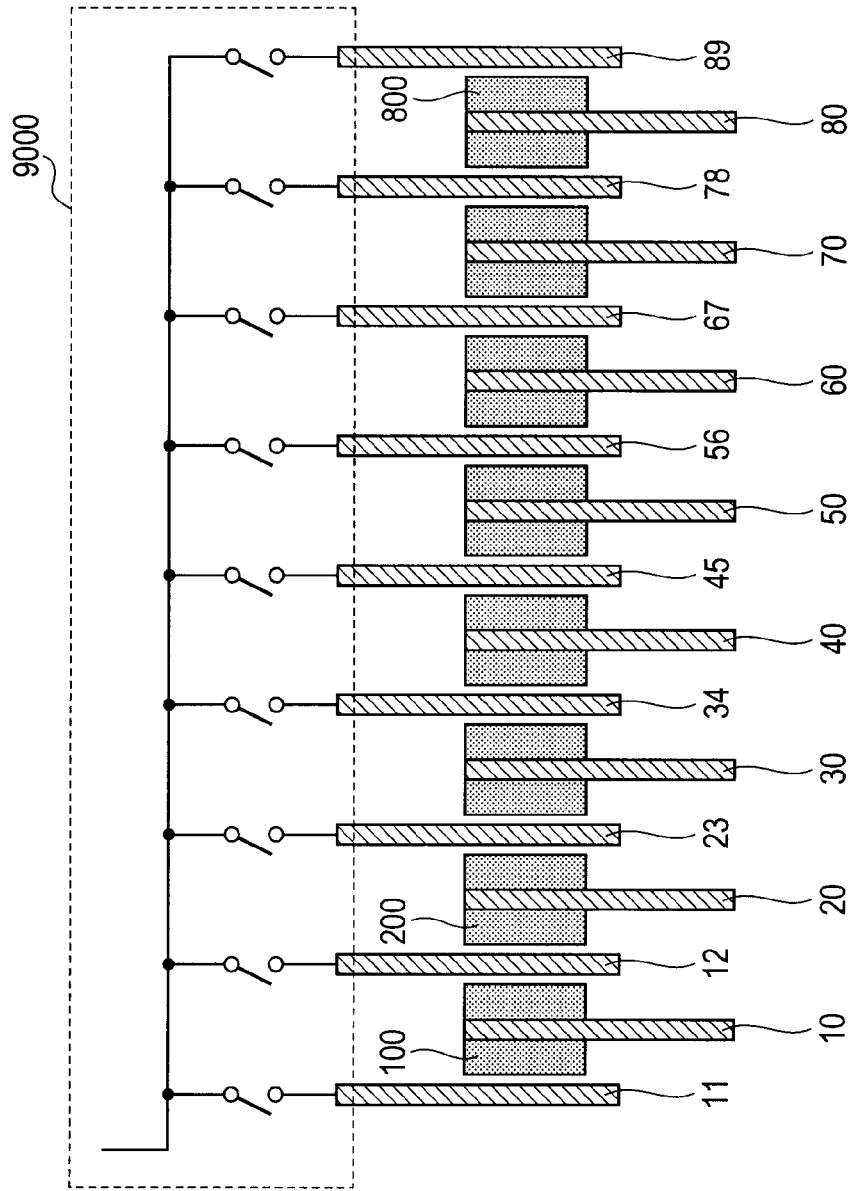
FIG. 6 is a diagram for illustrating a configuration example according to Example 3 of the present invention, in which all the common electrodes are connected to a single wiring via a switching device.

As Example 3 of the present invention, a configuration example of the LED device array in a different configuration from Example 2 is described with reference to FIG. 6. The same reference symbols as in the other drawings denote portions having the same functions. Example 3 is different from Example 2 in that all the n-type electrodes 11, 12, 23, 34, 45, 56, 67, 78, and 89 are connected to a single wiring (the same wiring) via a switching device 9000.

The switching device avoids simultaneous energization of the nearest shared electrodes, to thereby cause the LED light emitting portion to emit light on a desired side.

In this example, the switching device is incorporated in a silicon driver circuit, and the LED array is mounted on the surface of the silicon driver circuit. Accordingly, the LED array and the switching device can be connected by a semiconductor process. Further, manufacturing cost can be suppressed.

Other configurations and the drive method are the same as those in Example 2, and overlapping description is omitted.

EXAMPLE 4

Figure 8:
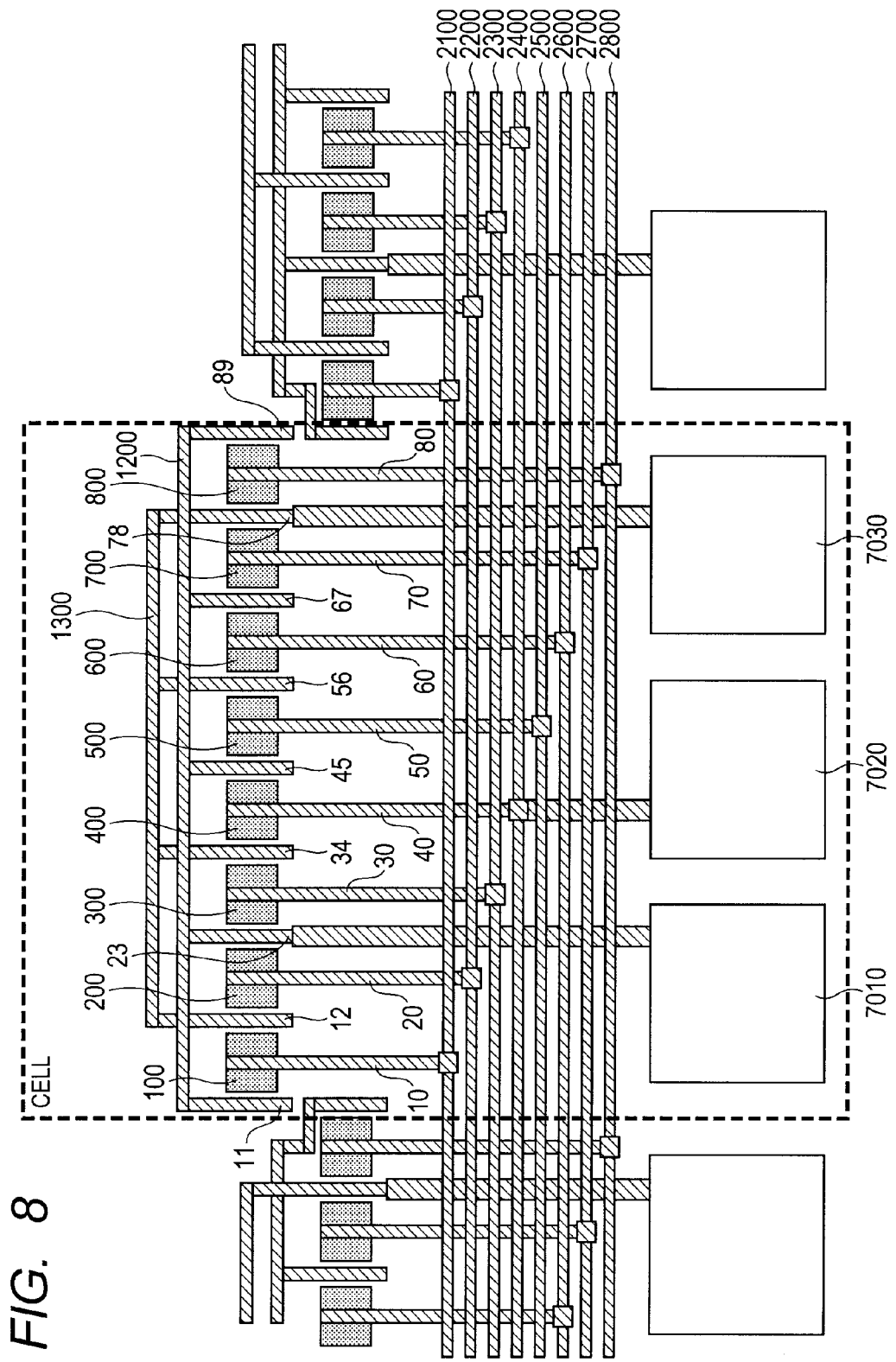
FIG. 8 is a conceptual diagram for illustrating Example 4 of the present invention.

FIG. 8 is a partial diagram of an LED array for describing an LED scanner for EP exposure according to Example 4 of the present invention. Referring to FIG. 8, LED light emitting portions 100, 200, 300, . . . , and 800 are arranged in proximity, p-type electrodes 10, 20, . . . , and 80 are formed at the center of the respective LED light emitting portions, and n-type electrodes 11, 12, 23, . . . , and 89 are formed on both sides of the respective LED light emitting portions. The n-type electrodes which are arranged between adjacent LED light emitting portions are shared by those LED light emitting portions on both sides.

Eight continuous LEDs surrounded by a dotted line share an n-side electrode wiring 1200 or 1300 to form a single cell.

On the other hand, p-side electrode wirings 2100, 2200, . . . , and 2800 are shared by eight continuous cells, and the eight continuous cells form a single block.

Note that, the cells are separated from one another by a groove that reaches a high resistance layer disposed on the substrate side of the current control layer in the LED device structure.

Referring to FIG. 8, the LED arrays are arranged to be shifted in the vertical scanning direction with respect to adjacent cells so that the LED light emitting portions 100 and 800 at the edges of the cell may occupy the n-type electrodes arranged at the edges of the cell. The LED arrays are arranged to be shifted in the vertical scanning direction by one scanning so as to adjust light emitting timing by one scanning. In this manner, a one-line exposure pattern is formed on the photosensitive drum.

Bonding pads 7010 and 7030 to be connected to the drive circuit are connected to the n-side electrode wirings 1200 and 1300, respectively. A bonding pad 7020 is connected to one of the eight p-side electrode wirings 2100, 2200, . . . , and 2800 shared in the block.

In this manner, the blocks are individually driven, and each cell is serially driven, thereby enabling high-speed scanning by parallel driving.

Figure 9:
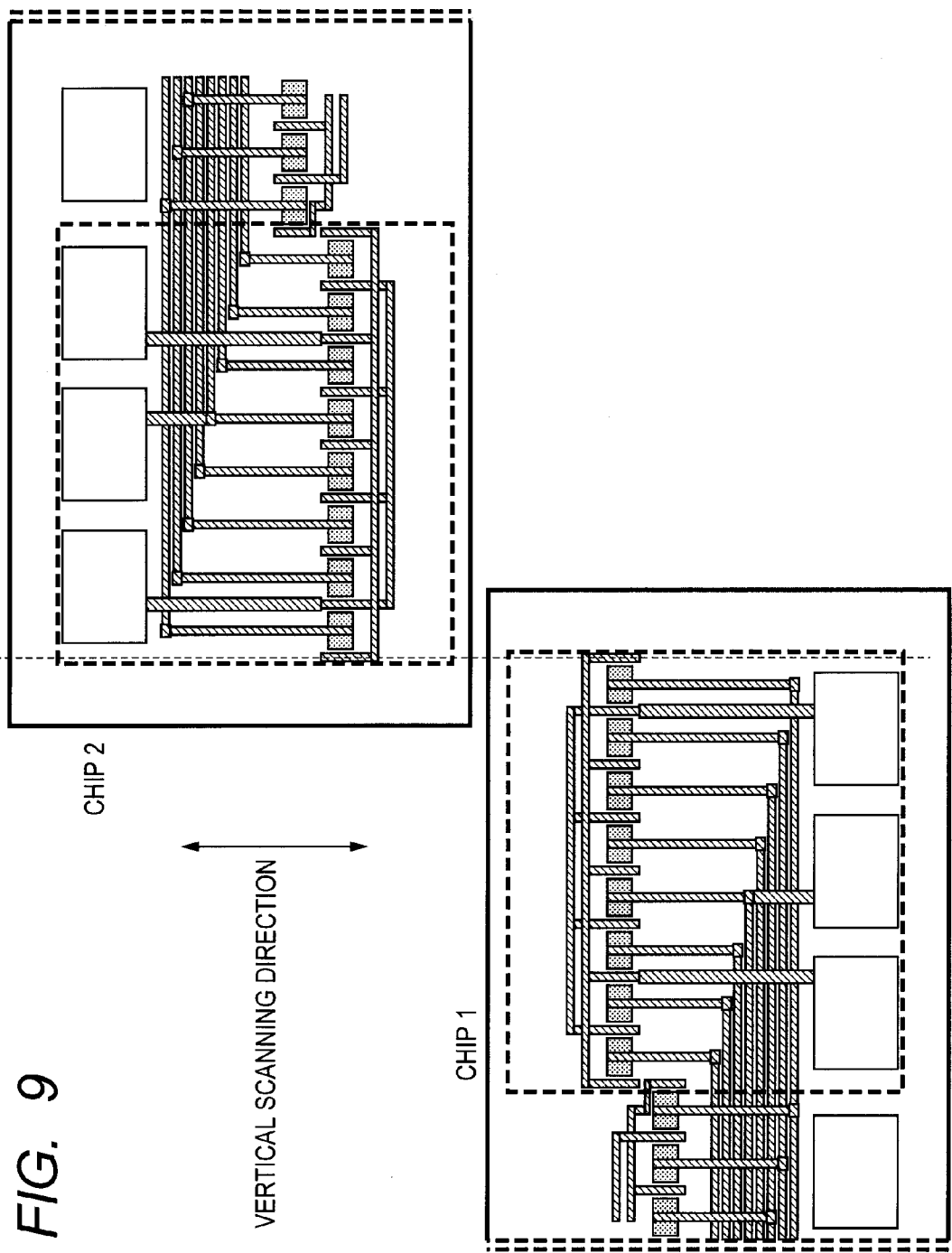
FIG. 9 is a conceptual diagram for illustrating Example 4 of the present invention.
Figure 10:
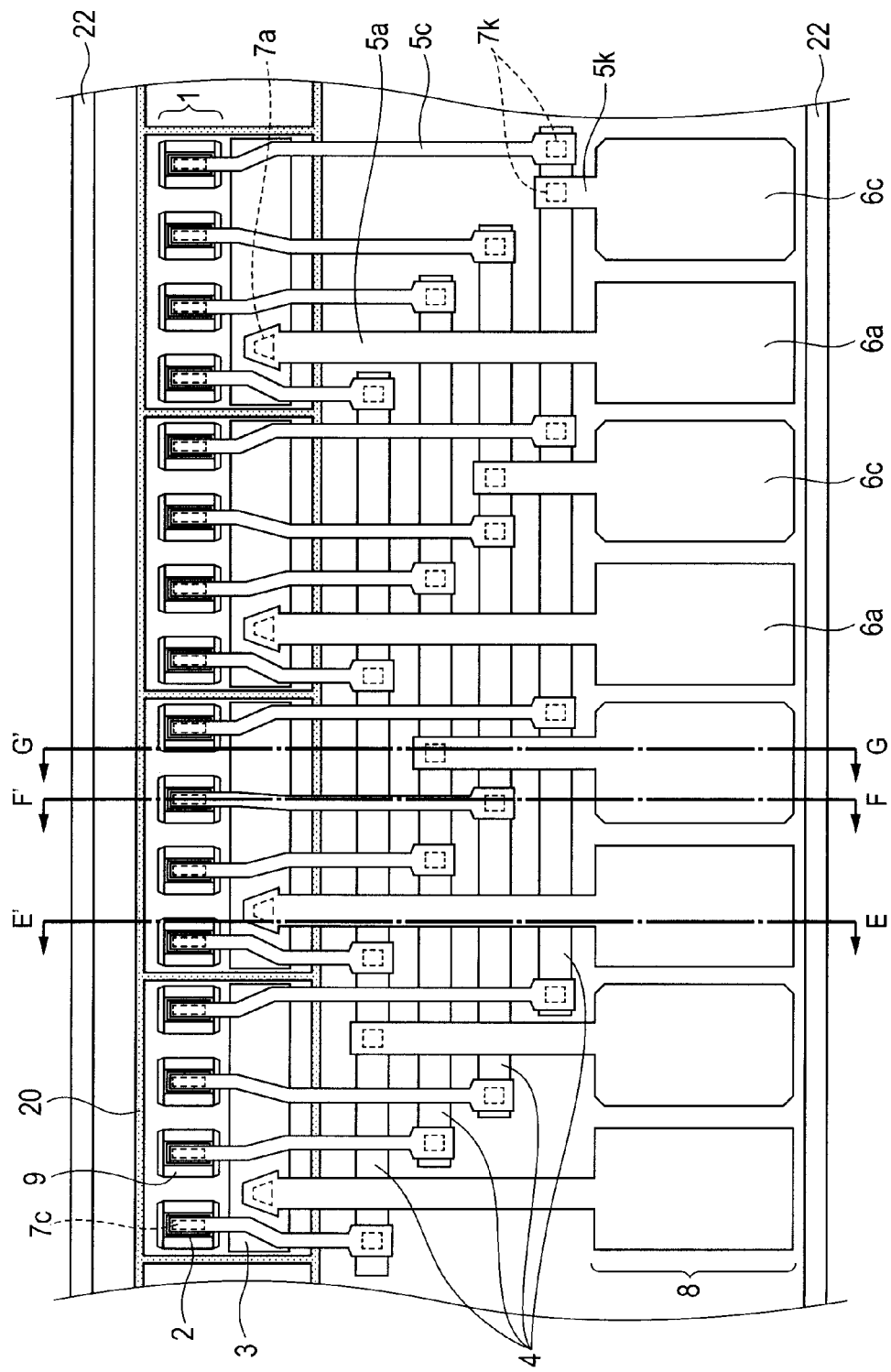
FIG. 10 is a diagram for illustrating a configuration in Japanese Patent Application Laid-Open No. 2005-064104 of the related art.

Referring to FIG. 9, an LED device array for use in an LED scanner as a light source for an EP exposure is obtained by arranging LED array chips each including multiple blocks in a zigzag manner. The LED array chips are arranged so that the projection of the n-type electrode positioned at the edge of one chip and the projection of the n-type electrode positioned at the edge of another chip may be superimposed in the vertical scanning direction. The direction of the chips is determined so that the light emitting portions of the chips come close to each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-154523 filed Jul. 13, 2011, and No. 2012-046711 filed Mar. 2, 1012, which are hereby incorporated by reference herein in their entirety.

What is claimed is:

1. A light-emitting device, comprising:
a carrier control layer provided on a substrate;
a lower clad layer provided on the carrier control layer;
an active layer provided on the lower clad layer;
an upper clad layer provided on the active layer;
a p-type electrode provided on the upper clad layer; and
at least two n-type electrodes arranged on the carrier control layer so as to dispose the p-type electrode between the at least two n-type electrodes in an in-plane direction of the substrate, and
wherein the carrier control layer comprises a group 3-5 compound semiconductor containing Al.

2. The light-emitting device according to claim 1, further comprising a current diffusion layer provided between the p-type electrode and the upper clad layer, for enhancing diffusion of p-type carriers in the in-plane direction of the substrate.

3. The light-emitting device according to claim 1, further comprising another n-type electrode other than the at least two n-type electrodes, which is provided on a surface of the light-emitting device opposite to a light emitting face.

4. The light-emitting device according to claim 1, wherein the p-type electrode and the at least two n-type electrodes are arranged on a same side with respect to the substrate.

5. The light-emitting device according to claim 1, wherein the carrier control layer is configured so that, when the p-type electrode and any one of the at least two n-type electrodes are energized, in a carrier recombination rate distribution in the active layer, a carrier recombination rate on the energized n-type electrode side is larger than a carrier recombination rate on other side of the at least two n-type electrode.

6. The light-emitting device according to claim 1, wherein the carrier control layer is configured so that, when the p-type electrode and any one of the at least two n-type electrodes are energized, a light emitting face of the light-emitting device is caused to emit light on the energized n-type electrode side, and, when the p-type electrode and the at least two n-type electrodes are energized, an entire light emitting face of the light-emitting device is caused to emit light.

7. A light-emitting device array, comprising a plurality of the light-emitting devices,
wherein each of the plurality of the light-emitting devices comprises:
a carrier control layer provided on a substrate;
a lower clad layer provided on the carrier control layer;
an active layer provided on the lower clad layer;
an upper clad layer provided on the active layer;
a p-type electrode provided on the upper clad layer; and
at least two n-type electrodes arranged on the carrier control layer so as to dispose the p-type electrode between the at least two n-type electrodes in an in-plane direction of the substrate, and
wherein one of the at least two n-type electrodes is shared by adjacent ones of the plurality of the light-emitting devices.

8. The light-emitting device array according to claim 7, further comprising a first wiring and a second wiring for connecting the at least two n-type electrodes, respectively,
wherein, in adjacent ones of the plurality of the light-emitting devices arranged in the array, one of the at least two n-type electrodes and another of the at least two n-type electrodes are alternately connected to the first wiring and the second wiring, respectively.

9. The light-emitting device array according to claim 7, wherein the at least two n-type electrodes of the plurality of the light-emitting devices arranged in the array are connected to a same wiring via a switching device.

10. The light-emitting device array according to claim 7, further comprising another n-type electrode other than the at least two n-type electrodes, which is provided on a surface of each of the plurality of the light-emitting devices of the light-emitting device array opposite to the light emitting face.

11. The light-emitting device array according to claim 7,
wherein the plurality of the light-emitting devices that share the n-type electrode form a cell,
a plurality of the cells that share a plurality of p-type wirings connected to the p-type electrodes of the plurality of the light-emitting devices form a block,
the plurality of the light-emitting devices include light emitting portions, the light emitting portions being shifted in a vertical scanning direction in adjacent ones of the plurality of the cells, and
the plurality of the cells are arranged so that projection of the n-type electrode positioned at an edge of one of the plurality of the cells and projection of the n-type electrode positioned at an edge of another of the plurality of the cells superimpose in the vertical scanning direction.

12. The light-emitting device array according to claim 11, wherein each of the plurality of the cells comprises:
a plurality of bonding pads to be connected to a plurality of the n-type electrodes; and
another bonding pad to be connected to one of the plurality of p-type wirings.

13. The light-emitting device array according to claim 11, further comprising light-emitting array chips each including a plurality of the blocks, the light-emitting array chips being arranged in a zigzag manner,
wherein adjacent ones of the plurality of the light-emitting array chips are arranged to be shifted in the vertical scanning direction so that projection of the n-type electrode of the light-emitting device at an edge of one of the light-emitting array chips and projection of the n-type electrode of the light-emitting device at an edge of another of the light-emitting array chips superimpose in the vertical scanning direction.

14. An image forming apparatus, comprising:
the light-emitting device array according to claim 7;
a photosensitive member for forming an electrostatic latent image by light from the light-emitting device array;
a charging unit for charging the photosensitive member; and
a developing unit for developing the electrostatic latent image.

15. The light-emitting device according to claim 7, wherein the carrier control layer is configured so that, when the p-type electrode and any one of the at least two n-type electrodes are energized, a light emitting face of the light-emitting device is caused to emit light on the energized n-type electrode side, and, when the p-type electrode and the at least two n-type electrodes are energized, an entire light emitting face of the light-emitting device is caused to emit light.

16. The light-emitting device according to claim 7, wherein the carrier control layer comprises a group 3-5 compound semiconductor containing Al.

17. A method of driving a light-emitting device array comprising a plurality of the light-emitting devices,
wherein each of the light-emitting devices comprises a carrier control layer provided on a substrate, a lower clad layer provided on the carrier control layer, an active layer provided on the lower clad layer, an upper clad layer provided on the active layer, a p-type electrode provided on the upper clad layer and at least two n-type electrodes arranged on the carrier control layer so as to dispose the p-type electrode between the at least two n-type electrodes in an in-plane direction of the substrate,
wherein one of the at least two n-type electrodes is shared by adjacent ones of the plurality of the light-emitting devices arranged in the array, wherein the plurality of the light-emitting devices that share the n-type electrode form a cell,
wherein a plurality of the cells that share a plurality of p-type wirings connected to the p-type electrodes of the plurality of the light-emitting devices form a block,
wherein the plurality of the light-emitting devices include light emitting portions, the light emitting portions being shifted in a vertical scanning direction in adjacent ones of the plurality of the cells,
wherein the plurality of the cells are arranged so that projection of the n-type electrode positioned at an edge of one of the plurality of the cells and projection of the n-type electrode positioned at an edge of another of the plurality of the cells superimpose in the vertical scanning direction, and
wherein the carrier control layer is configured so that, when the p-type electrode and any one of the at least two n-type electrodes are energized, a light emitting face of the light-emitting device is caused to emit light on the energized n-type electrode side, and, when the p-type electrode and the at least two n-type electrodes are energized, an entire light emitting face of the light-emitting device is caused to emit light,
comprising individually driving the blocks and serially driving each of the plurality of the cells.

* * * * *